United States Patent [19]
Hanson

[11] Patent Number: 6,097,567
[45] Date of Patent: *Aug. 1, 2000

[54] DISK DRIVE SYSTEM HAVING A REMOVABLE MODULE

[75] Inventor: George E. Hanson, Cedar Rapids, Iowa

[73] Assignee: Intermec IP Corp., Woodland Hills, Calif.

[*] Notice: This patent is subject to a terminal disclaimer.

[21] Appl. No.: 09/224,332

[22] Filed: Dec. 31, 1998

Related U.S. Application Data

[63] Continuation of application No. 09/087,546, May 29, 1998, Pat. No. 5,883,757, which is a continuation of application No. 08/459,250, Jun. 2, 1995, Pat. No. 5,764,434, which is a continuation of application No. 08/186,717, Jan. 25, 1994, Pat. No. 5,563,748, which is a continuation of application No. 08/022,789, Feb. 23, 1993, Pat. No. 5,327,308, which is a continuation of application No. 07/846,462, Mar. 3, 1992, abandoned, which is a division of application No. 07/499,861, Mar. 26, 1990, Pat. No. 5,122,914, which is a division of application No. 06/947,707, Dec. 30, 1986, Pat. No. 4,912,580, which is a division of application No. 06/707,154, Mar. 1, 1985, abandoned, which is a continuation-in-part of application No. 06/571,389, Jan. 17, 1984, Pat. No. 4,633,350.

[51] Int. Cl.[7] .................................................. G11B 5/012
[52] U.S. Cl. ............................................................. 360/97.01
[58] Field of Search .................................... 360/133, 135, 360/97.01–99.12

[56] References Cited

U.S. PATENT DOCUMENTS

| | | | |
|---|---|---|---|
| 3,697,084 | 10/1972 | Ban | 360/92 |
| 3,977,749 | 8/1976 | Langenbach | 339/75 |
| 4,062,049 | 12/1977 | Dirks | 360/78 |
| 4,125,305 | 11/1978 | Kasindorf | 312/320 |
| 4,501,455 | 2/1985 | Groseck | 312/215 |
| 4,633,350 | 12/1986 | Hanson . | |

FOREIGN PATENT DOCUMENTS 58-94189  6/1983  Japan .

OTHER PUBLICATIONS

Japan 57–94687 and English Language translation thereof.

Japan 57–118562 and English Language translation thereof.

Japan 52–21815 and English Language translation thereof.

"Low–Cost, Rack–Mounted, Direct–Access Disk Storage Device," IBM Technical Disclosure Bulletin, vol. 19, No. 10, Mar. 1977, pp. 3846–3849.

"Rack–Mounted Diskette Storage Device," IBM Technical Disclosure Bulletin vol. 19, No. 10 Mar. 1977.

*Primary Examiner*—A. J. Heinz
*Attorney, Agent, or Firm*—McAndrews, Held & Malloy, Ltd.

[57] ABSTRACT

A computer system providing for quick removal and quick and simple installation of a disk drive unit into the system. A latching and positioning arrangement provides releasable support for the disk drive unit and achieves automatic electric connections with the installation of the disk drive unit in the computer system.

41 Claims, 7 Drawing Sheets

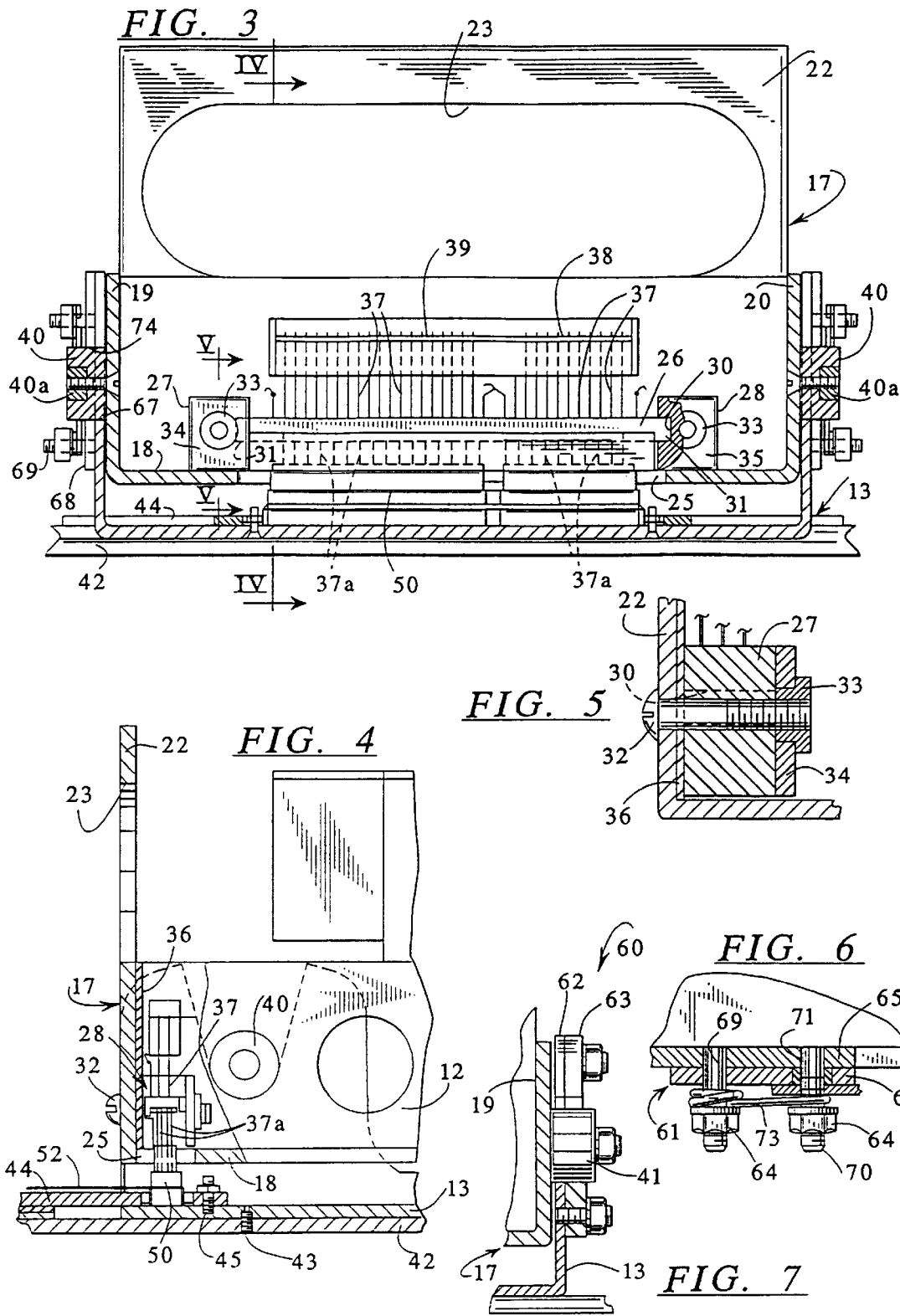

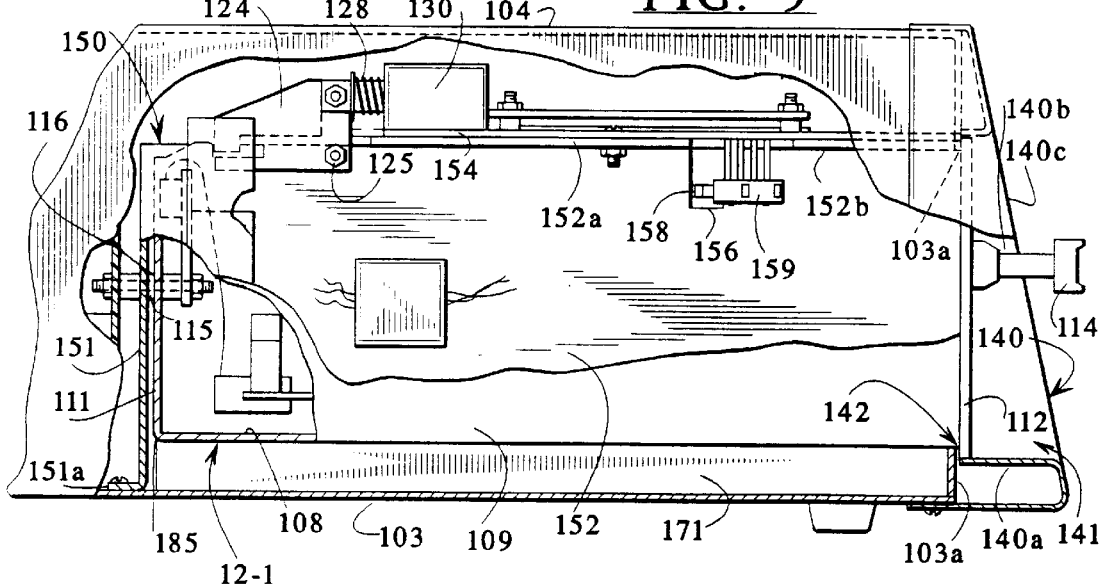
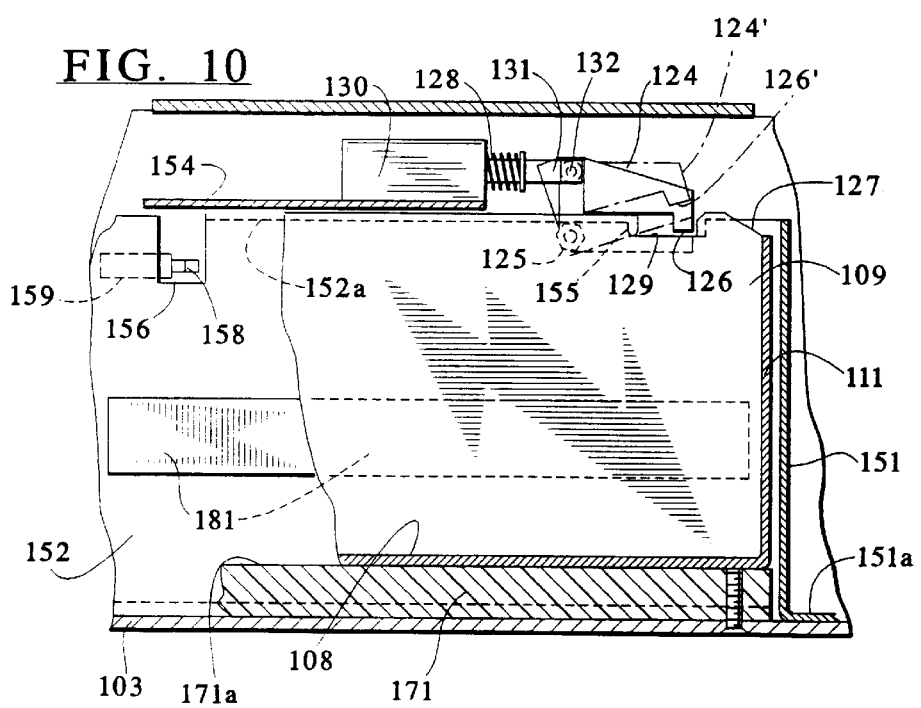

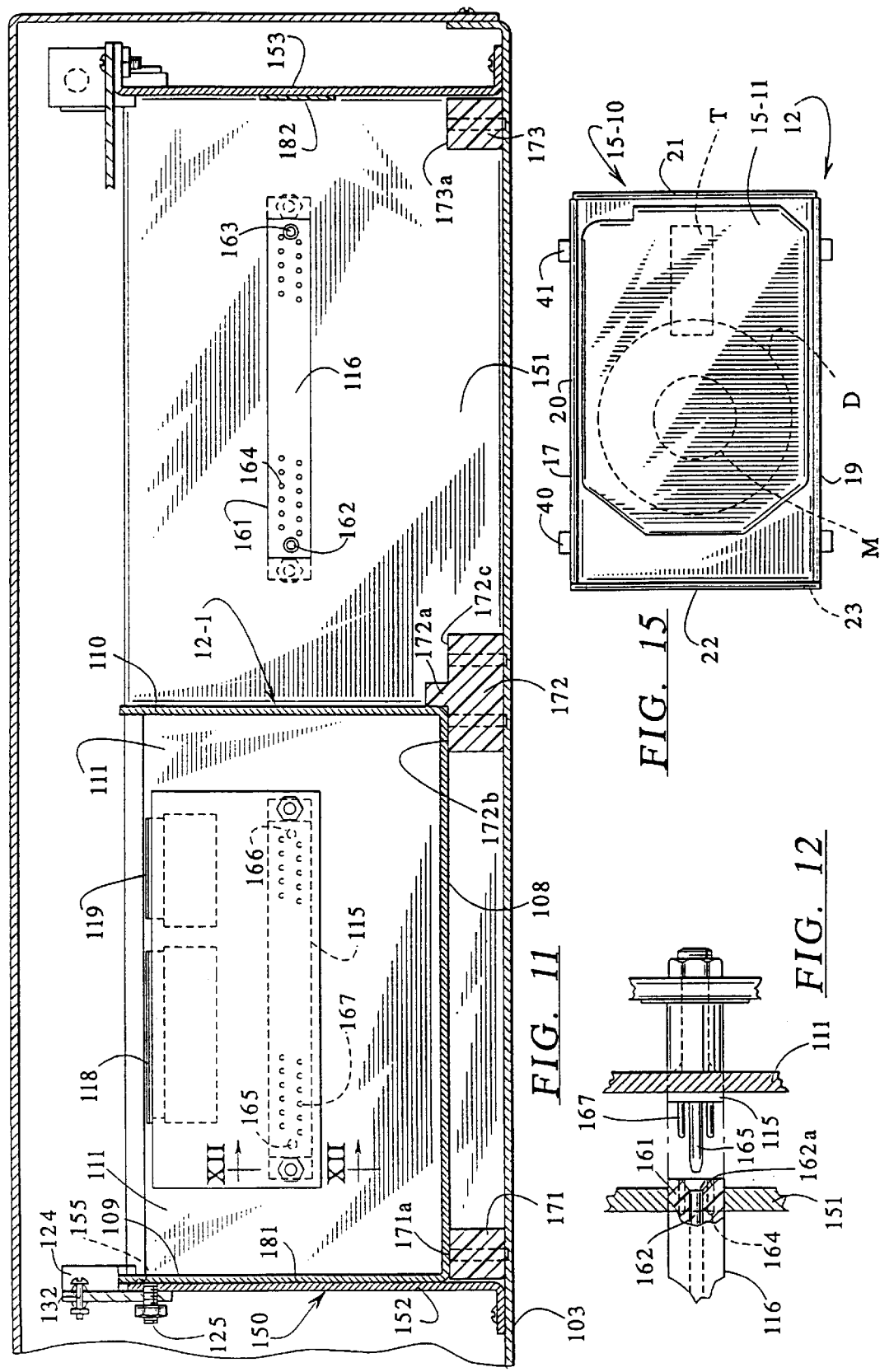

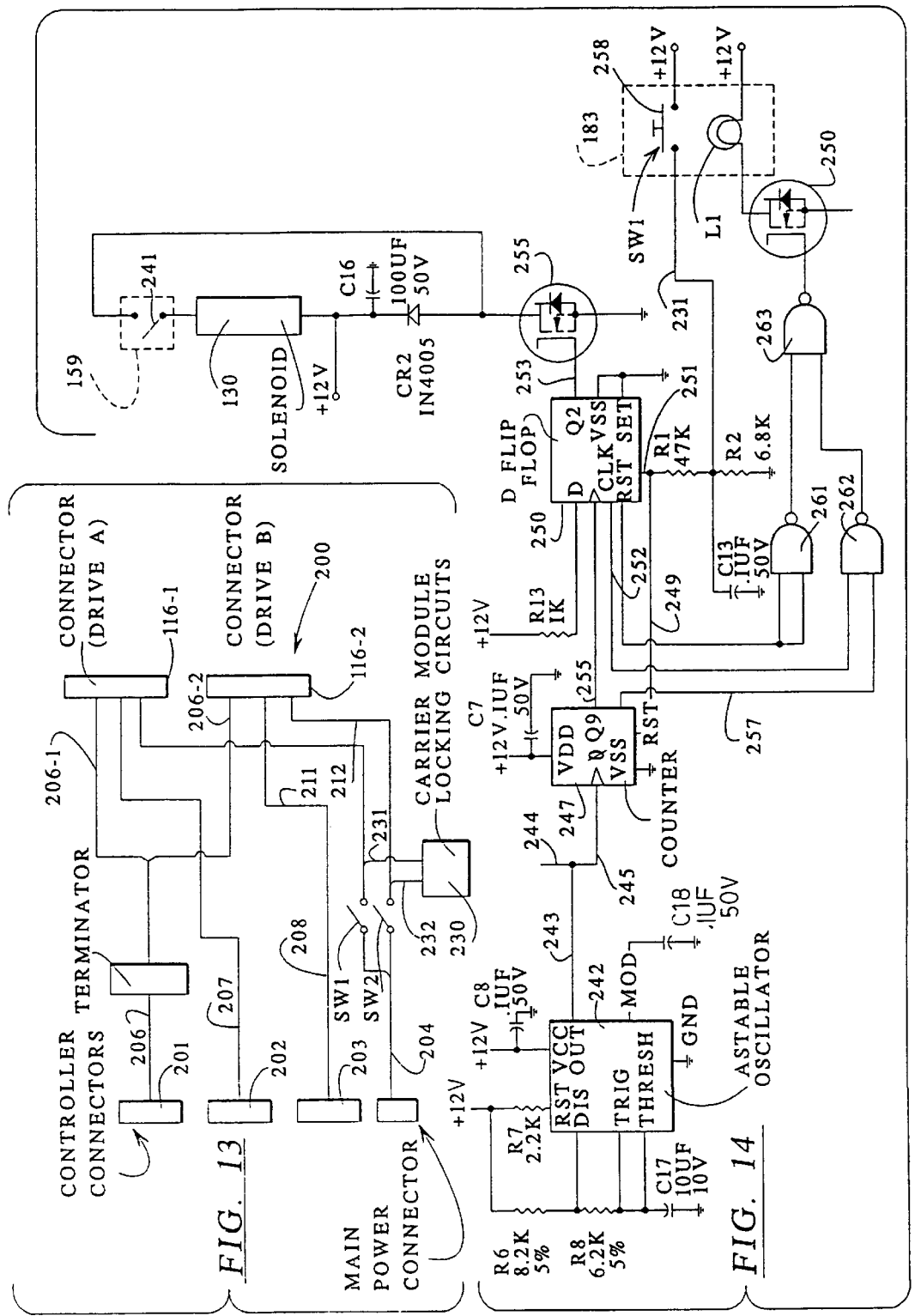

DISK DRIVE SYSTEM HAVING A REMOVABLE MODULE

CROSS-REFERENCE TO RELATED APPLICATIONS

The present application is a continuation of U.S. Ser. No. 09/087,546 filed May 29, 1998, which is a continuation of application U.S. Ser. No. 08/459,250 filed Jun. 2, 1995, now U.S. Pat. No. 5,764,434, issued Jun. 9, 1998, which is a continuation of application U.S. Ser. No. 08/186,717 filed Jan. 25, 1994, now U.S. Pat. No. 5,563,748 issued Oct. 8, 1996, which is a continuation of application U.S. Ser. No. 08/022,789 filed Feb. 23, 1993, now U.S. Pat. No. 5,327,308 issued Jul. 5, 1994, which is a continuation of U.S. Ser. No. 07/846,462, filed Mar. 3, 1992, now abandoned, which is a division of application U.S. Ser. No. 07/499,861 filed Mar. 26, 1990, now U.S. Pat. No. 5,122,914 issued Jun. 16, 1992, which is a division of application U.S. Ser. No. 06/947,707 filed Dec. 30, 1986, now U.S. Pat. No. 4,912,580 issued Mar. 27, 1990, which is a division of application U.S. Ser. No. 06/707,154 filed Mar. 1, 1985, now abandoned, which is a continuation-in-part of application Ser. No. 06/571,389 filed Jan. 17, 1984, now U.S. Pat. No. 4,633,350 issued Dec. 30, 1986.

INCORPORATION BY REFERENCE

The parent application, U.S. Ser. No. 09/087,546, and U.S. Pat. No. 4,912,580 are incorporated herein by reference in their entirety.

BACKGROUND OF THE INVENTION

This invention relates to an apparatus which permits quick removal of high capacity disk drive units from a receiving unit of a host computer system. The apparatus further provides quick, simple installation of the disk drive units into the computer system.

In order to provide greater flexibility in the operation of a computer system it is often desirable to incorporate several disk drive units into the system. Further, many applications permit the disk drive unit to be removed or interchanged for reasons of data security, backup purposes or for expanding a system. While this is a desirable feature, previous systems have required the computer operator to manually remove a number of connecting cables and to unscrew two thumb nuts to release the disk drive unit from its mounting in the host computer system.

Also in previous designs an occasional misalignment of ribbon cable connectors during installation of the disk drive unit improperly connected the drive unit and or damaged pins on the disk drive controller. Further, extended cable lengths used in these systems could result in some data validity problems.

BRIEF SUMMARY OF THE INVENTION

The invention relates to a disk drive information storage system wherein one or more disk drive carrier modules are detachably coupled with a receiving unit.

The invention provides a disk drive information storage system comprising a receiving unit having an electrical connector fitting secured thereon for the transmission of control and data signals, a disk drive carrier module for detachable coupling with said receiving unit, and having an electrical connector secured in fixed relation therewith for mating with the electrical connector fitting of said receiving unit, said receiving unit and said disk drive carrier module having cooperating positioning means automatically operable to position said carrier module in a final assembled position in relation to the receiving unit with said electric connector of said carrier module in mating relation to the electrical connector fitting of said receiving unit.

The invention further provides a disk drive information storage system of the foregoing type, with the carrier module having a carrier handle disposed for convenient carrying of the carrier module, and said cooperating positioning means providing for interengagement of the carrier module with the receiving unit solely by manipulation of said carrier module, and thereafter automatically guiding said carrier module into said final assembled position as manual insertion force is applied to said carrier handle.

The invention further provides in a disk drive information storage system, a receiving unit for the transmission of signals for the control of a disk drive, and a disk drive carrier module containing a disk drive and constructed for detachable coupling with said receiving unit to form a disk drive system, said receiving unit having a receptacle arranged to receive said carrier module and having carrier module guide means for guiding said carrier module during its insertion into said receptacle along an insertion path, said receiving unit and said carrier module having cooperating electrical connectors which are interconnected by movement toward each and said guide means constraining said carrier module such that the cooperating electric connectors automatically interconnect with each other as the carrier module is inserted into said receptacle.

The invention also provides in a disk drive information storage system, a receiving unit for the transmission of signals for the control of a disk drive, and a disk drive carrier module for containing a disk drive, and for detachable coupling with said receiving unit to form a complete disk drive system, said carrier module having first and second mounting lug means for effecting an interengagement of the carrier module with the receiving unit, said receiving unit having first retainer means for receiving said first lug means with the carrier module in a tilted orientation while accommodating a pivotable movement of the carrier module about said first retaining means toward a fully assembled position, and second latching type retainer means aligned with the second lug means in the tilted orientation of the carrier module such that the second lug means are automatically latched by the second retainer means as the carrier module is pivoted about the first retainer means into the fully assembled position, said lug means and said retainer means being automatically operable to secure said carrier module in said fully assembled position solely by manipulation of said data module as a whole.

Still further the invention provides in a disk drive information storage system as previously described, a disk drive carrier module of size to receive any of a plurality of disk drive units having respective different mounting hole requirements, and said disk drive carrier module having mounting means therein with patterns of mounting holes for selectively mounting any one of said plurality of disk drive units.

The present invention is directed to a disk drive carrier module which is quick and simple to remove from a host computer system and which can be quickly and accurately reinstalled in the system. A quick release arrangement for the disk drive module eliminates all manual insertions or extractions of connecting cables and automatically insures accurate positioning of the electrical connectors during final assembly of the disk drive module into the host computer system. This automatic positioning arrangement preferably provides support for two disk drive carrier modules.

Each module includes a carrier assembly to which a disk drive unit is mounted. The carrier assembly has an electrical connector member secured therewith and aligned with respect to a path of movement of the carrier module into its final installed operating position in the host computer system. Ribbon cables interconnect the disk drive unit with the electrical connector.

Each carrier module is mounted in the computer system in operative relation to a receiving unit having an interconnect board. The interconnect board serves to accurately support an electrical connector fitting which is connected to various computer system components in order to establish the desired power, data and control signal transmission paths as required. Each of the receiving units includes a guide mechanism which constrains the disk drive carrier module during its final movement into operating position such that the electrical connectors are automatically aligned and interconnected.

In one embodiment, after engagement of one end of a carrier assembly with a receptacle of the receiving unit, the second end of the carrier assembly is brought into a final assembled position by a downward force which separates latching members of one or more latching assemblies whereby mounting lugs at the second end of the carrier assembly are moved downward into engagement with cradling supports of the receiving unit receptacle. When the mounting lugs are fully seated in the supports the latching members are spring biased back to their normal latching position to positively secure the second end of the carrier assembly. Further, the electrical connector carried by the carrier assembly is automatically connected to a receiving electrical connector fitting to interconnect the electric circuit components as the mounting lugs are forced downward into the cradling supports. In a second embodiment, after initial interengagement and alignment of a carrier module with a recess or receptacle of the receiving unit, the carrier module is inserted longitudinally via precision guidance devices into its final assembled and electrically interconnected condition, and automatically latched in its operating position.

During removal of a disk drive carrier module from the computer system, a handle of the carrier assembly is manually engaged and the force applied to the handle automatically effects disengagement of all electrical connections during removal of the carrier module from its receptacle.

It is therefore an object of this invention to provide a quick release disk drive carrier module which eliminates all manual insertions or extractions of electrical cables normally associated with installing or removing a disk drive from a computer system.

It is another object of this invention to provide a disk drive system which provides automatic electrical connections when the disk drive is installed in a computer system.

It is yet another object of this invention to provide a cooperating latching and positioning arrangement which provides quick and accurate installation of a disk drive module in a computer system and which arrangement provides automatic electrical connections to the disk drive with its installation.

It is a further object of this invention to provide an arrangement for retaining a disk drive carrier module in a computer system which is automatically electrically releasable solely in response to manual forces applied to the carrier module.

These and other objects, advantages and novel features of the present invention, as well as details of illustrated embodiments thereof, will be more fully understood from the following description and drawings.

BRIEF DESCRIPTION OF THE SEVERAL VIEWS OF THE DRAWING

FIG. 3 is a enlarged vertical sectional view taken generally along the line III—III of FIG. 2, FIG. 4 is a vertical sectional view taken generally along the line IV—IV of FIG. 3, FIG. 5 is an enlarged vertical sectional view taken generally along the line V—V of FIG. 3;

FIG. 6 is an enlarged longitudinal sectional view taken generally along the line VI—VI of FIG. 3;

FIG. 7 is a vertical sectional view taken generally along the line VII—VII of FIG. 2;

FIG. 9 is an enlarged partial side elevational view of the receiving unit having a fully assembled disk drive carrier module therein, and with portions broken away and in section to show interior construction;

FIG. 10 is a partial further enlarged longitudinal sectional view showing a rear portion of the receiving unit and an associated disk drive carrier module latched in operating position in its receptacle;

FIG. 11 is a somewhat diagrammatic partial vertical transverse sectional view showing the receiving unit from the front, the right hand receptacle being empty to better illustrate the carrier module guide means and the electrical connector fitting mounted at a fixed predetermined relationship to the guide means for automatic interconnection with an electrical connector on the carrier module during insertion of the carrier module into the receptacle;

FIG. 12 is a partial enlarged longitudinal sectional view taken generally along the line XII—XII of FIG. 11, and showing cooperating electrical connectors of the receiving unit and of a disk drive carrier module in the process of being interconnected;

FIG. 13 shows a carrier module locking circuits component associated with a main power connector for insuring that a carrier module is not removed until the disk in the carrier module has stopped spinning;

FIG. 14 shows a circuit for implementing the carrier module locking means of FIG. 13; and FIG. 15 is a diagrammatic illustration showing a plan view of a disk drive module corresponding to that of FIG. 1; and indicating by dotted lines the rotary disk information storage means, the disk rotary drive means for effecting disk rotation, and the information transducer means for effecting disk scanning.

DETAILED DESCRIPTION OF THE INVENTION

Figure 1:
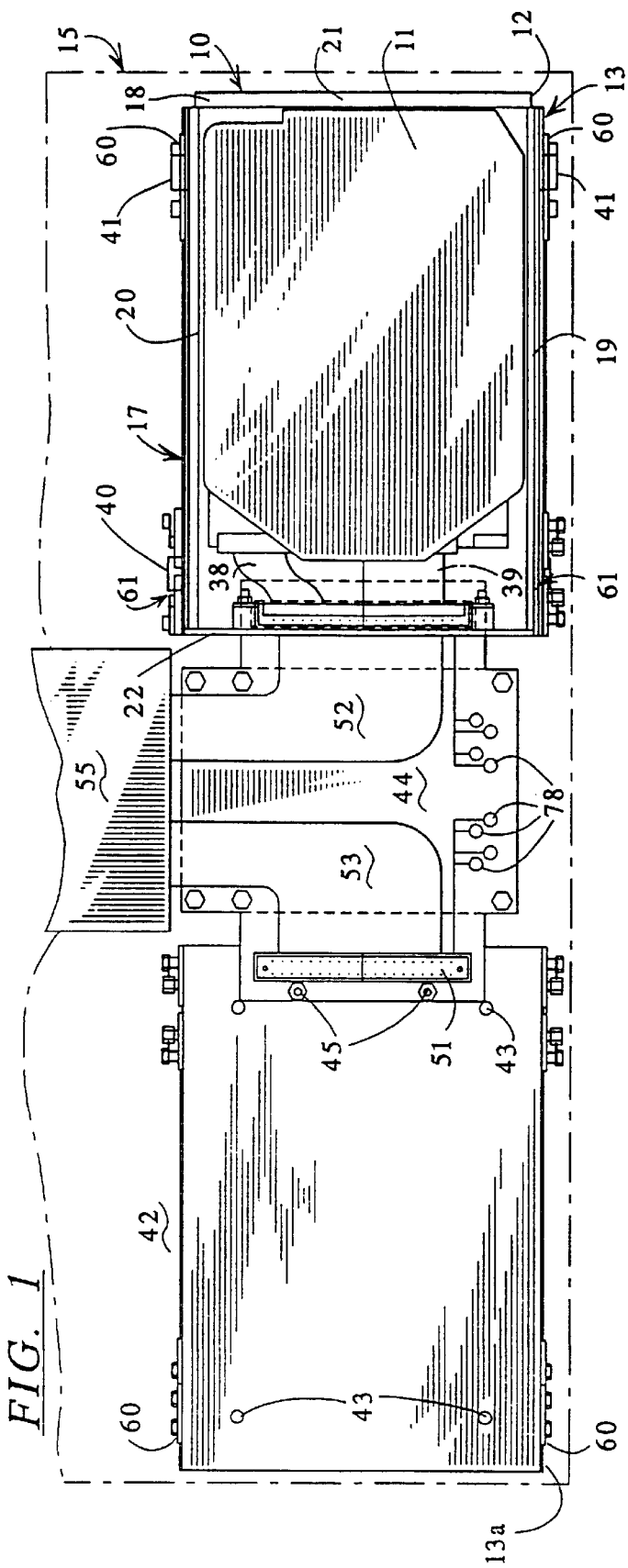
FIG. 1 is a somewhat diagrammatic plan view of a computer system incorporating disk drive carrier modules which are supported in a positioning and positive latching system constructed in accordance with the present invention.
Figure 2:
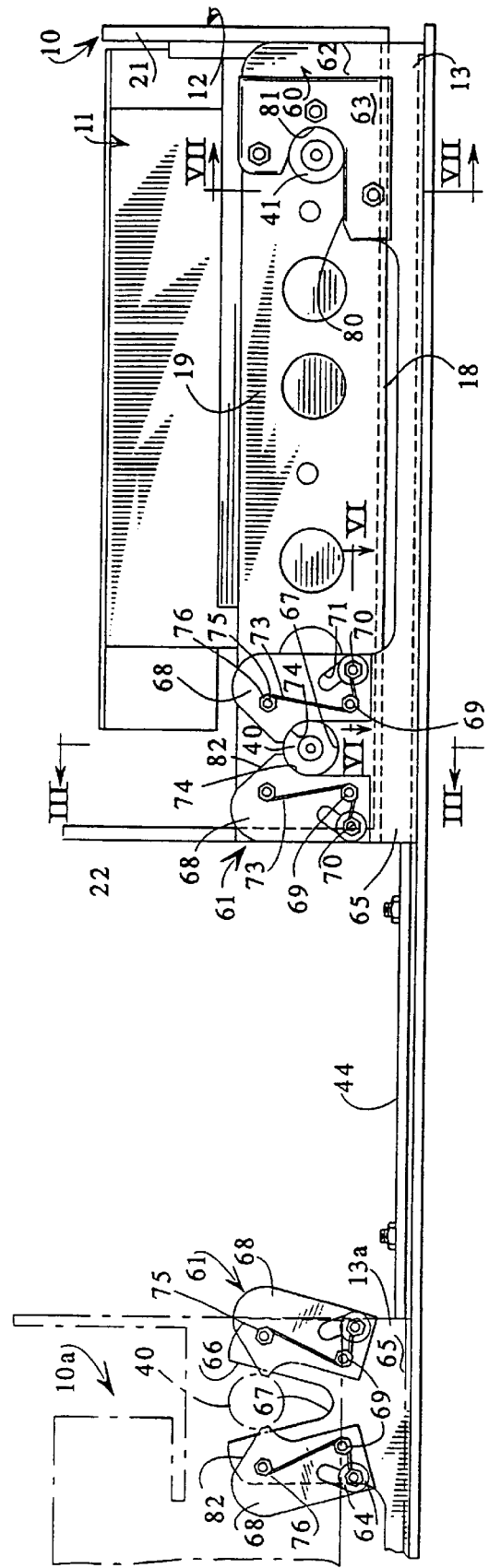
FIG. 2 is an enlarged fragmentary side elevational view of the latching system shown in FIG. 1.

FIG. 1 shows a disk drive module 10 providing storage for data on a magnetic storage disk in a high capacity disk drive unit 11, such as a Winchester unit or the like. The disk drive module 10 includes a disk drive carrier assembly 12 which provides a mounting hole arrangement which is capable of accepting virtually any 5¼" hard disk drive as well as some floppy disk drives. The module 10 is supported on a receiving unit which includes a base unit 13 and forms a fixed member in a host computer system 15. Preferably, the receiving unit of the computer system includes a second base unit 13a providing a receptacle for a second disk drive module 10a (shown in phantom in FIG. 2). The second fixed base unit 13a is also fixedly secured within wall enclosures of the system 15.

Each carrier assembly such as assembly 12 of the module 10 comprises a removable carrier frame 17 having a bottom plate 18; a pair of side walls 19 and 20; an outer end wall 21 and an inner end wall 22. The inner wall extends above adjacent side walls 19 and 20 and is provided with a carrier handle opening 23, FIG. 3, whereby the inner end of the carrier frame may be grasped by computer operator for installation or removal of the module from the receiving unit of the computer system 15.

An access opening 25, FIG. 3, is provided in the bottom plate 18, adjacent the inner side wall 22 and having an "Eurocard" type electrical connector 26 mounted to the carrier frame 17 immediately above and aligned with the access opening. A pair of clamping fixtures 27 and 28 retain the connector 26 mounted to the carrier frame 17 immediately above and aligned with the access opening. A pair of clamping fixtures 27 and 28 retain the connector 26 in a precise rigid position relative to the carrier frame 17. The clamping fixtures 27 and 28 are provided with a retaining channel 30 to support opposed extended end portions 31 of the connector 26. As best seen in FIG. 5 the clamping fixtures are secured against the end wall 22 by bolts 32 threaded into nuts 33. The nuts 33 form a unified portion of retaining plates 34 and 35 which are adapted to retain the end portions 31 of the connector in the channels 30. Thus it will be seen that the clamping fixtures together with the retaining plates 34 and 35 and the end wall 22 fixedly position the connector 26 in a precise orientation. As best seen in FIGS. 4 and 5 an insulating material 36 is interposed between the clamping fixtures and the end wall 22.

Connecting pins 37, extending upward from the electrical connector 26 serve as attachment means for a terminal end of ribbon cables 38 and 39 which provide electrical communication with the disk drive unit 11. Each carrier assembly is additionally provided with an inner and outer pair of mounting lugs 40 and 41. The mounting lugs are substantially identical and affixed to opposite ends of the side walls 19 and 20 by means of machine screws threaded into nuts 40a which are recessed into exterior surfaces of the mounting lugs as shown in FIG. 3.

Referring to FIGS. 1 and 4 it can be seen that the fixed base units 13 and 13a are fastened down to a base plate 42 of the computer system 15 by means of screws 43. Further an interconnect board 44 is positioned between inner ends of the base units 13 and 13a and is attached thereto by means of nut and screw connections 45. Adjacent each of these points of interconnection, electrical connector fittings 50 and 51 are accurately positioned and secured by means of screws fasteners or the like.

Electrical communication lines 52 and 53 extend from the fittings 50 and 51 respectively to related computer system components as required. Herein, the lines 52 and 53 are shown as ribbon connector cables, connected to a hard disk controller board 55, although various other electrical communication arrangements may be utilized in such a system, such as printed circuits or combinations of printed circuits and short ribbon cable jumpers.

As best seen in FIGS. 2, 3, 6 and 7 each fixed base unit 13 and 13a includes a pair of guide and retaining brackets 60, at a location remote from the connector fittings, and a pair of positive latching devices 61 positioned at predetermined locations adjacent the connector fittings. The guide and retaining brackets 60 comprise upturned side portions 62 of the base units with plastic insert members 63 bolted thereon to provide a guiding and retaining function for the mounting lugs 41 of the modules as will be described hereafter.

Each of the latching devices 61 includes an upturned inner side portion 65 of the base unit having an upwardly diverging recess 66 formed therein with a semi-circular seat portion 67. The seat portions are adapted to cradle the mounting lugs 40. Each latching device 61 further includes a pair of latching or clamping jaws 68 pivotally supported on studs 69 affixed to the inner side portion 65 and equally spaced, horizontally from the seat portion 67. A second stud 70, horizontally spaced from each stud 69, cooperates with an arcuate guide slot 71 to limit pivotal movement of the jaws 68. Further, a torsion spring 73 is provided to urge each of the jaws 68 to an upright latching position, wherein a latching surface 74 on complementary pairs of jaws complete a substantial encirclement of the mounting lugs 40. The seat portion 67 provides the encirclement about the lower portion of the lugs 40.

Nuts 64 retain the clamping jaws 68 and the springs 73 on their respective mounting studs 69 and 70. An additional stud 75 and nut 76 carried on the upper end of the jaws 68, serve to retain an extended leg of the torsion spring 73 in a biasing orientation. With the mounting lugs 41 at the outer end of the module supported in the brackets 60 and the mounting lugs 40 at the inner end secured in the latching devices 61 the disk drive module 10 is in a desired operating position relative to the base unit 13 and at the same time the connector fitting 50 is electrically engaged with connecting pins 37a of the electrical connector 26, extending downward through the access opening 25.

The Eurocard type connector in addition to transmitting control and data signals provides self diagnostic circuits to indicator lights 78, FIG. 1, which signal that a proper electrical connection has been made, that the required voltage is available and which of the two disk drive modules has been selected for operation.

To quickly and easily remove a disk drive module 10 from a base unit 13 of the computer system 15, power is switched off and the drive unit is allowed to spin down. When the disks have stopped rotating, the computer operator grasps the carrier handle 23 and pulls upward causing the mounting lugs 40 to cam open the clamping jaws 68 as seen at the left in FIG. 2. The lugs move upward between the jaws in a pivotal motion about the mounting lugs 41 which are still retained in the brackets 60. During this pivotal motion the electrical connections are severed.

Thereafter, as the lugs 40 clear the latching devices 61, the lugs 41 are moved longitudinally along a guide surface 80 of the insert members 63 and out of the retaining pockets or open slots 81 defined therein. The entire disk drive module 10 is now free to be removed.

When installing a disk drive module 10 in the computer system 15, the operator positions the carrier assembly 12 between the pair of guide and retaining brackets 50 with the mounting lugs 41 angled downward to rest on the guide surfaces 80. Thereafter the module is moved longitudinally along the surface 80 and into engagement with the retaining pockets 81. Then the inner end of the carrier assembly is pivoted downward about the axis of the mounting lugs 41 and into contact with upper camming faces 82 of the clamping jaws 68. The mounting lugs 40 cam open the jaws 68 against the bias of the springs 73 to pass downward into the seat portions 67 of the latching devices 61. At this point the latching surfaces 74 of the jaws 68 will have enclosed about the upper portions of the lugs 40 to positively secure the disk drive module 10 in a precise operating position. The camming faces 82 further insure proper orientation of the carrier assembly 12 relative to the fixed base and the connector fitting during the final pivotal movement of installation. This insures that a proper electrical connection will be made without damaging the connecting pins 37a. Thus all the required electrical transmission paths are automatically completed with installation of the disk drive module 10.

Although the teachings of my invention have herein been discussed with reference to a specific embodiment, it is to be understood that these are by way of illustration only and that variations and modifications may be effected. For example, if desired only a single disk drive module may be incorporated into the computer system, or in some applications it may be desirable to utilize three or more units. Accordingly, it should be understood that I wish to embody within the scope of the patent warranted hereon all such modifications as reasonably and properly come within the scope of my contribution to the art.

Description of FIGS. 8–12

Figure 8:
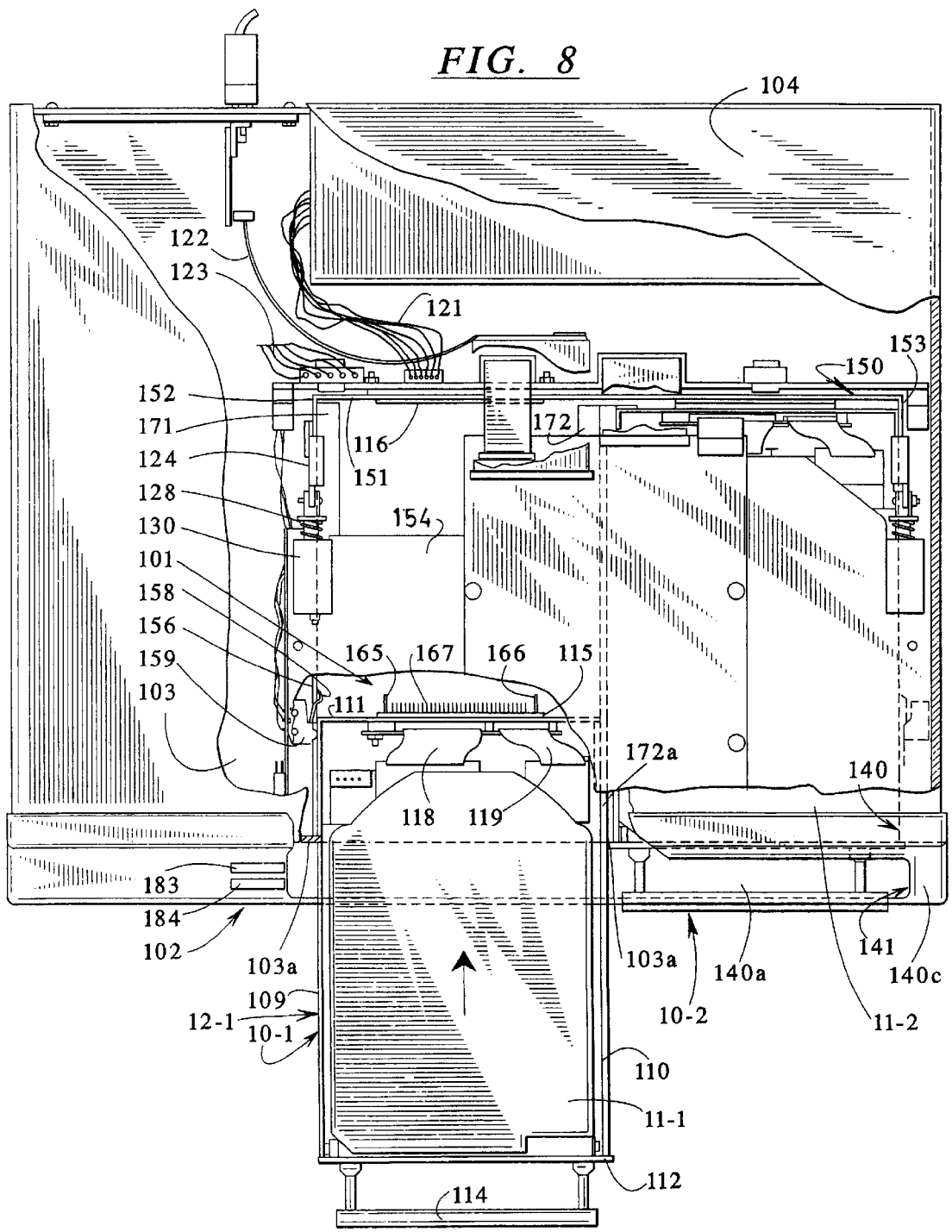
FIG. 8 is a somewhat diagrammatic partial plan view of a second embodiment of a disk drive information storage system in accordance with the present invention showing, a first disk drive carrier module in fully assembled position and showing a second disk drive carrier module in the process of being inserted into a receptacle of the receiving unit.

FIG. 8 shows disk drive modules 10-1 and 10-2 which generally correspond with the disk drive module 10 of FIG. 1 in providing storage for data or other information, for example by means of magnetic storage disks in respective high capacity disk drive units, such as Winchester units or the like. Respective disk drive units are indicated at 11-1 and 11-2 in FIG. 8. Each disk drive module includes a disk drive carrier assembly such as 12-1 which provides a mounting hole arrangement capable of accepting virtually any 5¼" hard disk drive as well as some floppy disk drives.

The disk drive carrier modules 10-1 and 10-2 are shown as being insertable into respective side-by-side receptacles such as 101 of a receiving unit 102. The receiving unit includes a chassis 103 on which various system components are mounted, and a cooperating top cover 104. By way of example the receiving unit 102 may serve as an information storage expansion system for addition to a computer system which includes a central processing unit with integrated floppy disk storage devices, and further auxiliary devices such as a keyboard and monitor, and a printer.

Each carrier assembly such as 12-1 comprises a bottom wall 108, FIGS. 9 and 10, side walls 109, 110, FIG. 8, a rear wall 111, FIGS. 9 and 10, and a front wall 112. The front wall 112 is provided with a carrier handle 114 which may be grasped by the operator in transporting the carrier module, and in inserting and removing the carrier module with respect to its receptacle in the receiving unit.

An aperture in the rear wall 111 allows the mating end of an electrical connector 115 of each carrier module to project rearwardly for automatic interconnection with cooperating connector fittings 116 of the receiving unit.

The particular disk drive such as unit 11-1 which is mounted in each respective carrier module is electrically connected with the connector 115 by means of ribbon cables such as 118 and 119 and releasable connector terminal means corresponding to that shown in FIG. 3 for ribbon cables 38 and 39. It will be noted that ribbon cables 118 and 119 are of minimum length and extend between the rear end of the particular disk drive unit such as 11-1 and the adjoining connector 115. The ribbon cables 118 and 119 extend between parts all of which are secured with the carrier module, so that the ribbon cables 118 and 119 need not include extra length to accommodate a disassembly operation or the like.

Similarly, the electrical wiring such as indicated at 121, 122 and 123 in FIG. 8 which leads to the electrical connector fitting 116 of the receiving unit, extends between parts which are all secured with the chassis 103. All electrical connections between the receiving unit and the carrier modules are completed automatically as the carrier modules are inserted into their receptacles, and there is no need for manual grasping of ribbon cables and manipulation thereon to complete the electrical connections.

As best seen in FIG. 10, the receiving unit has latching members such as 124 which are pivotally mounted as at 125 so that a latching nose 126 projecting from member 124 engages a cam face 127 at the rear of the carrier module side wall 109 as the carrier module is inserted into its receptacle. A compression spring 128 acts to urge the latching member 124 in a clockwise direction as viewed in FIG. 10, while allowing the latching member to pivot in a counterclockwise direction about pivot 125 in response to cam face 127. The carrier module side wall 109 has a recess 129 into which the latching nose 126 pivots as the carrier module reaches its final assembled position. By way of example, the latching members such as 124 may be of rigid synthetic (plastic) material such as nylon.

A solenoid 130 has an armature extension 131 pivotally connected with the latch member 124 at 132. In deenergized condition of solenoid 130, the spring 128 holds a rear edge face of nose 126 in confronting relation to a rear wall of recess 129 so as to lock the carrier module in its receptacle. Upon energization of solenoid 130, however, the armature extension 131 is retracted against the action of spring 128, to lift nose 126 to position 126', FIG. 10, clear of recess 129, thereby allowing manual removal of the carrier module from its receptacle. With solenoid 130 energized, the handle 114 can be grasped and the carrier module removed, simultaneously effecting disconnection of the electrical connectors such as 115. 116. FIG. 8.

Referring to FIG. 9, a front cover 140 is shown which is secured to the front edge of chassis 103. The cover 140 has an access opening 141 which is defined by inturned flanges such as 140a and 140b which tend to support and guide the carrier modules 10-1 and 10-2 as they are being manually positioned for insertion into the respective receptacles. The front surface of the cover 140 has a sloping front panel configuration at 140c so that flange 140a at the lower edge of opening 141 is more accessible for initially supporting the rear edges of the carrier modules during their alignment with the receptacles.

The chassis 103 includes an upturned front flange 103a, FIG. 9, which has a height corresponding to the vertical height of the front cover 140 and has rectangular apertures such as 142 formed therein corresponding to the cross sectional dimensions of the respective carrier modules. As can be seen in FIG. 9, the plate defining front wall 112 of each carrier module abuts against a margin of the respective receiving aperture defined by flange 103a when the carrier module has been fully inserted into its receptacle. The sides and rear of the carrier module receptacles are provided by an open enclosure frame 150, FIG. 9. A rear wall 151 of the enclosure frame 150 has a lower outturned flange 151a which is fastened to chassis 103. The enclosure frame 150 also provides side walls 152, 153, FIG. 8, having outturned flange portions at the upper margins thereof such as indicated at 152a and 152b, FIG. 9, which carry solenoid mounting plates 154 at each side of the enclosure frame.

As seen in FIG. 10, the top edge of each side wall of the enclosure frame has a relatively shallow notch at 155 and a relatively deeper notch at 156. The shallow notch at 155 accommodates movement of the nose portion 126 of latch member 124 to its latching position when the notch 129 reaches the position shown in FIG. 10.

The deeper notch 156, FIG. 10, accommodates a mechanical sensor element 158 of a microswitch assembly 159. As shown in FIG. 8, the sensor element 158 projects through notch 156 and into receptacle 101 until such time as the carrier module 12-1 deflects the sensor element as the carrier module moves into the receptacle. Thus, when microswitch assembly 159 is in nonactuated condition, the associated receptacle does not have a fully inserted carrier module.

As seen in FIGS. 11 and 12, the rear wall 151 of the enclosure frame includes rectangular openings 161 which receive the forward portions of the respective connector fittings 116. By way of example, each fitting 116 may have a pair of alignment holes 162, 163 and two rows of electrical contact sockets 164. By way of example, in addition to alignment pins 165, 166, FIG. 11, there may be sixty pins 167, FIG. 12, on each connector 115 for fitting into respective sockets 164 of each connector fitting 116. As shown in FIG. 12, the alignment pins such as 165 have tapered tip ends, and the alignment holes have frustoconical entrance portions 162a for correcting any slight misalignment before the contact pins 167 reach their respective contact sockets 164.

The precise guidance of the carrier modules such as 12-1, FIG. 11, is carried out by guide means including supporting guide rails shown at 171, 172 and 173 of synthetic (plastic) material such as nylon. The side rails 171 and 173 provide smooth broad support surfaces 171a, 173a having a relatively substantial width dimension, for example one-half inch (1.27 centimeter). The center guide rail has a center ridge 172a separating support surfaces 172b and 172c each of which may have the same width as support surfaces 171a and 173a.

To complete the low friction precision guidance for the carrier modules, abrasion resistant lateral guide strips 181 and 182, FIG. 11, are secured to the inner sides of side walls 152 and 153 of the enclosure frame.

Suitable manually actuated switches may be located at the front cover 140 at 183 and 184 for manual depression to energize the respective solenoids 130 until such time as the associated disk drive carrier module has been retracted from its receptacle to a position such as indicated for carrier module 10-1 in FIG. 8. At this time, sensor element 158 is cleared, allowing it to return to its non-actuated position whereby the energizing circuit for the associated solenoid 130 may be interrupted to deenergize the solenoid.

In loading a disk drive carrier module, the handle 114 may be grasped with one hand while the other hand guides the carrier module into the front access opening 141, FIG. 9, in alignment with the desired receptacle such as 101, FIG. 8. The extended lower flange 140a and the sloping front panel 140c with side flanges such as 140b facilitate the initial alignment of the carrier module and its engagement with the supporting surfaces such as 171a, 172b, FIG. 11. The rectangular apertures such as 142, FIG. 9, in the upstanding chassis flange 103a insure that the carrier modules are smoothly guided into their respective receptacles with lateral guidance thereafter being effected by means of the center guide ridge 172a FIG. 11, in conjunction with the outer lateral guide strips 181 and 182. The carrier modules have a rounded rear lower margin at 185 to further facilitate insertion into the respective receptacles.

The guidance means 171–173 and 181–182, FIG. 11, are disposed with a precision such that the alignment pins such as 165, FIG. 12, are reliably interengaged with the receiving alignment holes 162, 163; the interengagement of the alignment or pilot means 162, 163, 164, 165 in turn insures the precise alignment of the electrical contact pins 167 of connectors 115 with the contact sockets 165 of the fixed connector fittings 117 as the carrier modules complete their insertion movement. Thus the carrier module electric circuits are reliably automatically interconnected with the circuits of the receiving unit simply by pushing the carrier modules into their receptacles.

The cam means 127, FIG. 10, on each carrier module automatically lift the latch members 124 to the position indicated at 124' as the carrier modules approach the fully inserted position; thereafter springs such as 128, FIG. 10, press the latches 124 into latching engagement with notches 129 of the carrier modules to latch the carrier modules in the fully assembled position as shown in solid outline in FIG. 10.

It will be apparent that many modifications and variations may be made without department from the scope of the teachings and concepts of the present invention.

Description of FIGS. 13 and 14

In the embodiment of FIGS. 13 and 14, the system of FIGS. 8–12 is provided with a single interconnect board 200 for mounting two sixty pin connectors 116-1 and 116-2, each corresponding to connector 116 of FIG. 8, and the connectors 116-1 and 116-2 being physically arranged so as to automatically connect with connectors such as 115, FIG. 8, on the respective carrier modules 10-1 and 10-2, FIG. 8. FIG. 13 shows further connectors 201-204 which are mounted on the board 200 for providing communication with the host computer system.

Referring to FIG. 13, there is shown extending from connector 201 a tristate bus 206 leading to the connectors 116-1 and 116-2 via respective branches 206-1 and 206-2. The connectors 202 and 203 lead to a signal bus 207 for the first disk drive associated with connector 116-1 and to a signal bus 208 for the second disk drive associated with connector 116-2, respectively. The connector 204 supplies a power bus 211 for the first disk drive under the control of power switch contacts SW1, and supplies a power bus 212 for the second drive under the control of power switch contacts SW2. The manually operated switches 183 and 184, FIG. 8, may control contacts SW1 and SW2, respectively, such that successive manual actuations of the switches alternately open and close the contacts. The circuitry of board 200 enables the selective disconnection of power from either one of the disk drives and removal of the associated carrier module from its receptacle without affecting the operation of the remainder of the system. The board 200 provides signal line terminating resistors as indicated at 214 to replace the corresponding resistors which are normally located on only one drive. The bus 206 provides a respective single drive select signal line e.g. to pin 47 of connectors 116-1 and 116-2, eliminating the requirement to cut the drive select shunts on the disk drives 11-1 and 11-2, FIG. 8. Providing signal termination component 214 and discrete disk drive selection makes the set up for both of the drives 11-1 and 11-2 identical.

FIG. 13 shows means 230 on the circuit board 200 for sensing when power is removed from one of the disk drives and for insuring that the associated carrier module is not removed from its receptacle until the disk in the carrier module has stopped spinning. A specific exemplary circuit for this purpose is illustrated in FIG. 14. The circuit of FIG. 14 receives as its control input a twelve volt power line 231, FIG. 13, which reflects the condition of contacts SW1 of switch 183. An analogous twelve volt power line 232, FIG. 13, reflects the condition of contacts SW2 of switch 184, and may control a second circuit corresponding to that shown in FIG. 14. In FIG. 14, the carrier module locking means 230 of FIG. 13 is implemented as a circuit which prevents energizing of the latch control solenoids such as 130, FIG. 10, until a suitable time delay after the associated disk drive has been deenergized. As shown in FIG. 10, as long as solenoid 130 remains deenergized, the associated carrier module is positively held in its receptacle by means of latch 126. It is found that if removal of the carrier module is prevented for a specific time such as forty-five seconds that the drive is reliably prevented from being moved until the disk in the drive has stopped spinning. In the illustrated embodiment, switches 183 and 184, FIG. 8, are illuminated switches, and the circuit of FIG. 14 causes the switch which has been actuated to open circuit condition to blink during the spin down time of the associated drive. When the timing cycle is completed, the switch remains deenergized. As the drive is removed from its receptacle, a mechanical sensor such as 158, FIG. 8, is released, opening contacts of a microswitch 159, FIG. 8.

In FIG. 14, a portion of the circuit 230 which is applicable to the left hand receptacle 101, FIG. 8, is illustrated. Thus, FIG. 14 has been correlated with FIGS. 8–13, by showing solenoid 130, microswitch 159, switch 183 and power line 231. In FIG. 14, the illumination means associated with switch 183 is indicated at L1, and the switch contacts associated with switch 159 are designated by reference numeral 241. FIG. 14 shows the condition of contacts SW1 of manual switch 183 and of contacts 241 of microswitch 159, corresponding to the position of carrier module 10-1 in FIG. 8. In this condition, illumination means L1 is deenergized. In FIG. 14, astable oscillator 242 has an output line 243 supplying a time base for the solenoid locking circuits for the respective receptacles. Thus line 244 may lead to a circuit similar to that shown in FIG. 14 for controlling the latch control solenoid of the second receptacle, for example the right hand receptacle as viewed in FIG. 8. The line 245 then serves to supply time base pulses to the circuit associated with the left hand receptacle which is specifically designated by reference numeral 101 in FIG. 8.

Reference numeral 247 designates a counter circuit which may be held in a reset condition via line 249 so long as switch contacts SW1, FIG. 13, are closed and energizing power is supplied to the associated connector 116-1, FIG. 13. A flip-flop circuit 250 is also held reset via a line 251. With flip-flop 250 reset, output 252 is at a high logic level, this output being the complement of the output at 253. With a ground potential at output 253, transistor 255 is nonconducting, and solenoid 130 is held deenergized. Output 257 from counter 247 and output 252 of flip-flop 250 may be such in the reset condition of these components that transistor 250 is in a conducting state and lamp L1 is illuminated. This represents the operating state with a disk drive in place and energized.

When it is desired to remove the disk drive associated with the circuit of FIG. 14, switch 183 is actuated to place contacts SW1, FIG. 13, in open circuit condition, removing all power from connector 116-1. The switch SW1 may include individual contact means 258, FIG. 14, controlling the supply of twelve volt power to connector 116-1 and to twelve volt power line 231. Opening of contact means 258 removes the voltage from lines 249 and 251 so that counter 247 and flip-flop 250 become active. At selected counting states of counter 247, line 257 is momentarily driven to a high logic state, causing transistor 250 to switch off momentarily and lamp L1 to blink. By way of example, lamp L1 may blink twice per second during the counting cycle of counter 247. Flip-flop 250 remains reset until the completion of the counting cycle, for example covering a time interval of about forty-five seconds. At the end of the counting cycle of counter 247, output 255 thereof goes high, triggering flip-flop 250. At this time output 253 of flip-flop 250 goes high, turning on transistor 255 and energizing solenoid 130 to shift the latch to its release position shown at 126', FIG. 10. The carrier module 10-1 may now be removed whereupon microswitch 159 is released to its normally open position. With the carrier module 10-1 removed, contacts 241 of microswitch 159 are in open condition, deenergizing solenoid 130.

When a carrier module such as 10-1 is inserted into receptacle 101 as indicated in FIG. 8, a ground clip (not shown) on the end wall of the receptacle engages the rear wall of the carrier module and removes static charge before the pins 167, FIG. 11, engage with the connector 115-1, FIG. 13. By way of example, the tapered configuration at 162a and 165, FIG. 12, may allow for a slight misalignment between locating pins 165, 166 and sockets 162, 163, e.g. plus or minus seven and one-half mils (±0.0075 inch). With the carrier module 10-1 in operating position, switch 183 may be actuated to supply operating power to the connector 115-1.

Exemplary Details

By way of example, guides 171, 172 and 173 may be formed of "Nylatron" which is an engineering plastic formulated from nylon having embedded granulated glass fibers and impregnated with molybdenum disulfide, so that the guides are effectively self-lubricating.

In a specific implementation of component 230, FIG. 13, the time base circuit 242, FIG. 14, utilized a type LM 555 integrated circuit whose output was coupled to the counting inputs of two type 4020 14-stage ripple carry binary counters. One such counter served as component 247, FIG. 14, with pin 9, the Q1 output being connected with line 257 and with pin 12, the Q9 output, being connected with line 255. A dual D flip-flop circuit type 4013 provided a flip-flop for controlling each solenoid. NAND gates such as 261–263, FIG. 14, were provided by a type 4011 quad two-input NAND gate circuit.

The foregoing illustrated embodiments show systems which are in successful operation. Such systems are given by way of example only, and the scope of the invention is defined by the appended claims.

DESCRIPTION OF FIG. 15

FIG. 15 shows a disk drive module 15-10 corresponding to disk drive module 10 of FIG. 1. The disk drive module of FIG. 15, as described with reference to FIG. 1, may comprise a high capacity disk drive unit 15-11, such as a Winchester unit, and a disk drive carrier assembly or disk drive mounting assembly 12. Component 12 of FIG. 15 may be identical to the disk drive carrier assembly of FIGS. 1–7, and accordingly, the same reference numerals have been applied to this component in FIG. 15.

As is well known in the art, a complete high capacity disk drive unit such as represented in FIG. 15 is comprised of rotary disk information storage means (indicated diagrammatically at D in FIG. 15), disk rotary drive means (indicated diagrammatically at M in FIG. 15) and disk scanning information transducer means (indicated diagrammatically at T in FIG. 15). The module 15-10 of FIG. 15 may be termed a self-contained portable disk drive module.

Many modifications and variations of the present invention are possible in light of the above teachings. Thus, it is to be understood that, within the scope of the appended claims, the invention may be practiced otherwise than as described hereinabove.

What is claimed and desired to be secured by Letters Patent is:

1. A data storage system comprising:
    a base unit having a power source and a receptacle, said receptacle having substantially parallel side portions and a first plurality of conductors fixedly secured at an end of said receptacle; and
    a removable module insertable into said receptacle, said removable module having
        a disk drive unit, said disk drive unit having a transducer for converting information stored on an information storage disk into electrical signals, a motor for effecting rotation of said information storage disk, said motor utilizing power from said power source of said base unit for operation, and a housing;
        a carrier for mounting said disk drive unit, said carrier having side walls substantially parallel to each other and substantially parallel to an axis of rotation of said information storage disk; and
        a second plurality of conductors fixedly secured at an end of said removable module, said second plurality of conductors being operatively coupled to said disk drive unit;
    said second plurality of conductors of said removable module being engageable in mating relation to said first plurality of conductors of said receptacle of said base unit in response to a loading force for moving said removable module into a final assembled position in said receptacle, said side walls of said carrier being guided by said side portions of said receptacle during movement of said removable module into said final assembled position wherein all required electrical transmission paths between said base unit and said disk drive unit are completed, said removable module being removable from said final assembled position in said base unit without affecting operation of a remainder of the system.

2. The data storage system of claim 1 further comprising a releasable locking mechanism for locking said removable module in said final assembled position.

3. The data storage system of claim 1 further comprising a sensor for sensing that said removable module is in said final assembled position.

4. The data storage system of claim 3 further comprising a visual indicator responsive to said sensor for indicating to a user that said removable module is in said final assembled position.

5. The data storage system of claim 1 further comprising a sensor for sensing that said disk drive unit has been selected for operation.

6. The data storage system of claim 5 further comprising a visual indicator responsive to said sensor for indicating to a user that said disk drive unit has been selected for operation.

7. The data storage system of claim 1 further comprising a visual indicator for indicating to a user that said removable module is in said final assembled position.

8. The data storage system of claim 1 further comprising a visual indicator for indicating to a user that said disk drive unit is operating.

9. The data storage system of claim 1 wherein said information storage disk is a hard disk.

10. The data storage system of claim 1 wherein said transducer converts electrical signals into a form suitable for storing on said disk.

11. The data storage system of claim 1 where in all required electrical transmission paths comprise data, control and power paths.

12. The data storage system of claim 1 further comprising a system that aligns said first and second pluralities of conductors and mounts said removable module in said final assembled position in said receptacle.

13. The data storage system of claim 1 wherein said base unit has a first single connector that comprises said first plurality of conductors, and wherein said removable module has a second single connector that comprises said second plurality of conductors.

14. The data storage system of claim 1 further comprising circuitry that enables said removable module to be removed from said final assembled position in said base unit without affecting operation of a remainder of the system.

15. A data storage system comprising:
    a base unit having a first plurality of conductors fixedly secured therein and a power source; and
    a removable module insertable into said base unit, said removable module having
        a disk drive unit, said disk drive unit having a transducer for converting information stored on an information storage disk into electrical signals, a motor for effecting rotation of said information storage disk, said motor utilizing power from said power source of said base unit for operation, and a housing;
        a carrier for mounting said disk drive unit, said carrier having side walls substantially parallel to each other and substantially parallel to an axis of rotation of said information storage disk; and
        a second plurality of conductors fixedly secured at an end of said removable module, said second plurality of conductors being operatively coupled to said disk drive unit;
    said second plurality of conductors of said removable module being engageable in mating relation to said first plurality of conductors of said base unit in response to a loading operation for moving said removable module into a final assembled position in said base unit, said side walls of said carrier guiding said removable module during movement of said removable module into said final assembled position wherein all required electrical transmission paths between said base unit and said disk drive unit are completed, said removable module being removable from said final assembled position in said base unit without affecting operation of a remainder of the system.

16. The data storage system of claim 15 further comprising a sensor for sensing that said removable module is in said final assembled position.

17. The data storage system of claim 16 further comprising a visual indicator responsive to said sensor for indicating to a user that said removable module is in said final assembled position.

18. The data storage system of claim 15 further comprising a sensor for sensing that said disk drive unit has been selected for operation.

19. The data storage system of claim 18 further comprising a visual indicator responsive to said sensor for indicating to a user that said disk drive unit has been selected for operation.

20. The data storage system of claim 15 further comprising a visual indicator for indicating to a user that said removable module is in said final assembled position.

21. The data storage system of claim 15 further comprising a visual indicator for indicating to a user that said disk drive unit is operating.

22. The data storage system of claim 15 further comprising a releasable locking mechanism for locking said removable module in said final assembled position.

23. The data storage system of claim 15 wherein said transducer converts electrical signals into a form suitable for storing on said disk.

24. The data storage system of claim 15 wherein all required electrical transmission paths comprise data, control and power paths.

25. The data storage system of claim 15 further comprising a system responsive to said loading operation for aligning said first and second pluralities of conductors and mounting said removable module in said final assembled position in said base unit.

26. The data storage system of claim 15 wherein said base unit has a first single connector that comprises said first plurality of conductors, and wherein said removable module has a second single connector that comprises said second plurality of conductors.

27. The data storage system of claim 15 wherein said information storage disk is a hard disk.

28. The data storage system of claim 15 further comprising circuitry that enables said removable module to be removed from said final assembled position in said base unit without affecting operation of a remainder of the system.

29. A data storage system comprising:
a base unit having a power source;
a first plurality of conductors fixedly secured in the base unit;
a disk drive unit comprising a transducer for converting information stored on an information storage disk into electrical signals, a motor for effecting rotation of the information storage disk, the motor utilizing power from the power source of the base unit for operation, and a housing,
a carrier for mounting the disk drive unit;
a second plurality of conductors, the second plurality of conductors being operatively coupled to the disk drive unit;
a system responsive to a loading operation for aligning said first and second pluralities of conductors and mounting said carrier, with said disk drive unit mounted thereto, in a final assembled position in the base unit wherein said first and second pluralities of conductors engage to complete all required electrical transmission paths between said base unit and said disk drive unit for operation of said disk drive unit, said carrier and disk drive unit being removable from said final assembled position in said base unit without affecting operation of a remainder of the system.

30. The data storage system of claim 29 further comprising a releasable locking mechanism for locking said carrier and disk drive unit in said final assembled position.

31. The data storage system of claim 29 further comprising a sensor for sensing that said disk drive unit has been selected for operation.

32. The data storage system of claim 31 further comprising a visual indicator responsive to said sensor for indicating to a user that said disk drive unit has been selected for operation.

33. The data storage system of claim 29 further comprising a visual indicator for indicating to a user that said carrier and disk drive unit are in said final assembled position.

34. The data storage system of claim 29 further comprising a visual indicator for indicating to a user that said disk drive unit is operating.

35. The data storage system of claim 29 further comprising circuitry that enables said carrier and disk drive unit to be removed from said final assembled position in said base unit without affecting operation of a remainder of the system.

36. The data storage system of claim 29 wherein said transducer converts electrical signals into a form suitable for storing on said disk.

37. The data storage system of claim 29 wherein all required electrical transmission paths comprise data, control and power paths.

38. The data storage system of claim 29 further comprising a first single connector that comprises said first plurality of conductors and a second single connector that comprises said second plurality of conductors.

39. The data storage system of claim 29 further comprising a sensor for sensing that said carrier and disk drive unit are in said final assembled position.

40. The data storage system of claim 39 further comprising a visual indicator responsive to the sensor for indicating to a user that said carrier and disk drive unit are in said final assembled position.

41. The data storage system of claim 29 wherein said information storage disk is a hard disk.

* * * * *